(12) United States Patent
Lee

(10) Patent No.: US 9,335,369 B2
(45) Date of Patent: May 10, 2016

(54) SEMICONDUCTOR INTEGRATED CIRCUIT

(71) Applicant: SK hynix Inc., Gyeonggi-do (KR)

(72) Inventor: Tae-Yong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 204 days.

(21) Appl. No.: 14/109,374

(22) Filed: Dec. 17, 2013

(65) Prior Publication Data

US 2015/0061725 A1    Mar. 5, 2015

(30) Foreign Application Priority Data

Aug. 30, 2013  (KR) .................. 10-2013-0104265

(51) Int. Cl.
*G01R 31/28* (2006.01)
*G01R 31/3185* (2006.01)
*G01R 31/317* (2006.01)

(52) U.S. Cl.
CPC ...... *G01R 31/2853* (2013.01); *G01R 31/31723* (2013.01); *G01R 31/318513* (2013.01); *G01R 31/318533* (2013.01); *H01L 2224/16145* (2013.01)

(58) Field of Classification Search
USPC .................................................... 324/762.01
See application file for complete search history.

(56) References Cited

U.S. PATENT DOCUMENTS

| | | | | |
|---|---|---|---|---|
| 8,198,627 B2 * | 6/2012 | Jeong | ................. | G01R 31/2884 257/48 |
| 2011/0024890 A1 * | 2/2011 | Yang | .................... | H01L 21/486 257/686 |
| 2011/0093235 A1 * | 4/2011 | Oh | .................... | G01R 31/31726 702/120 |
| 2011/0316572 A1 * | 12/2011 | Rahman | ............. | G01R 31/2853 324/754.03 |
| 2012/0105093 A1 * | 5/2012 | Lee | ..................... | G01R 31/2853 324/762.01 |
| 2012/0138927 A1 * | 6/2012 | Kang | ............ | G01R 31/318513 257/48 |
| 2012/0292759 A1 * | 11/2012 | Ishikawa | ................. | H01L 22/34 257/737 |
| 2012/0314511 A1 * | 12/2012 | Ishikawa | ............ | G01R 31/2884 365/189.05 |
| 2014/0049280 A1 * | 2/2014 | Kim | ....................... | H01L 22/32 324/754.19 |
| 2014/0175439 A1 * | 6/2014 | Lee | ..................... | H01L 25/0657 257/48 |
| 2014/0175667 A1 * | 6/2014 | Lee | ..................... | H01L 25/0657 257/774 |

FOREIGN PATENT DOCUMENTS

KR    1020110076680    7/2011

OTHER PUBLICATIONS

WideIO2 Specification, JEDEC Standard, Aug. 2013, pp. 75-85, JEDEC Standard No. 229-2, JEDEC Solid State Technology Association, VA, USA.

* cited by examiner

*Primary Examiner* — Jermele M Hollington
*Assistant Examiner* — Douglas X Rodriguez
(74) *Attorney, Agent, or Firm* — IP & T Group LLP

(57) ABSTRACT

A semiconductor integrated circuit includes a test bump pad, a first bump pad coupled to a first through-silicon-via (TSV), a second bump pad coupled to a second TSV, a latching unit, coupled between the test bump pad and the first bump pad, suitable for storing data, and a switching unit suitable for selectively coupling the first bump pad to the second bump pad in response to a test operation control signal.

21 Claims, 8 Drawing Sheets

US 9,335,369 B2

SEMICONDUCTOR INTEGRATED CIRCUIT

CROSS-REFERENCE TO RELATED APPLICATIONS

The present application claims priority of Korean Patent Application No. 10-2013-0104265, filed on Aug. 30, 2013, which is incorporated herein by reference in its entirety.

BACKGROUND

1. Field

Exemplary embodiments of the present invention relate to a semiconductor design technology, and more particularly, to a semiconductor integrated circuit having a stacked package structure.

2. Description of the Related Art

In general, a packaging technology of a semiconductor integrated circuit has been developed to satisfy minimization and mounting reliability thereof. Recently, various technologies for a stacked package have been developed in order to realize a high performance and minimization of electric/electronic products.

The "stack" structure in a semiconductor industry represents that at least two semiconductor chips or packages are vertically laminated. For example, a semiconductor memory device may be implemented to have a memory capacitance two times more than a memory capacitance implemented during a semiconductor integrated process. Moreover, since stacked packages may have advantages in view of the increase in a memory capacitance and the efficiency of a mounting density and a mounting area, a research and development for the stacked packages have been accelerated.

The stacked package may be fabricated by a method for packaging stacked semiconductor chips at once after semiconductor chips are individually stacked and a method for stacking packaged individual semiconductor chips. The individual semiconductor chips of the stacked package are electrically coupled to each other through a metal wire or a through-chip-via, e.g., through-silicon-via (TSV). Especially, a stacked package using a TSV electrically and physically couples semiconductor chips to each other vertically by forming the TSV in the semiconductor chips.

FIG. 1 is a block diagram illustrating a conventional semiconductor integrated circuit.

Referring to FIG. 1, a semiconductor integrated circuit 100 includes first to fourth semiconductor chips 110 to 140, first to fourth TSVs TSV00 to TSV03, TSV10 to TSV13, TSV20 to TSV23 and TSV30 to TSV33, and first to fourth bump pads BP00 to BP03, BP10 to BP13, BP20 to BP23 and BP30 to BP33.

The first to fourth semiconductor chips 110 to 140 are vertically stacked, and include first to fourth internal circuits 111 to 117, 121 to 127, 131 to 137 and 141 to 147, which are coupled to the first to fourth TSVs TSV00 to TSV03, TSV10 to TSV13, TSV20 to TSV23 and TSV30 to TSV33, respectively.

The first to fourth TSVs TSV00 to TSV03, TSV10 to TSV13, TSV20 to TSV23 and TSV30 to TSV33 penetrate vertically the first to fourth semiconductor chips 110 to 140, and are arranged at a same line in each of the first to fourth semiconductor chips 110 to 140. The first to fourth TSVs TSV00 to TSV03, TSV10 to TSV13, TSV20 to TSV23 and TSV30 to TSV33 are vertically coupled to each other between the first to fourth semiconductor chips 110 to 140. That is, the first TSVs TSV00, TSV10, TSV20 and TSV30 are vertically coupled to each other. The second TSVs TSV01, TSV11, TSV21 and TSV31 are vertically coupled to each other. The third TSVs TSV02, TSV12, TSV22 and TSV32 are vertically coupled to each other. The fourth TSVs TSV03, TSV13, TSV23 and TSV33 are vertically coupled to each other.

The first to fourth internal circuits 111 to 117, 121 to 127, 131 to 137 and 141 to 147 may include an input/output circuit, respectively.

The memory capacitance of the semiconductor integrated circuit 100 increases as the number of stacked semiconductor chips increases.

However, since the first to fourth TSVs TSV00 to TSV03, TSV10 to TSV13, TSV20 to TSV23 and TSV30 to TSV33 have a common coupling node, the first to fourth semiconductor chips 110 to 140 may receive signals simultaneously but may not output the signals simultaneously. Thus, the semiconductor integrated circuit 100 has a fixed bandwidth although the number of the stacked semiconductor chips increases.

Meanwhile, it is possible to increase a bandwidth by increasing the number of TSVs, which penetrate the first to fourth semiconductor chips 110 to 140, respectively. However, in such a case, since the first to fourth internal circuits 111 to 117, 121 to 127, 131 to 137 and 141 to 147 are additionally disposed in the first to fourth semiconductor chips 110 to 140, an area of the semiconductor chips increases.

SUMMARY

Various exemplary embodiments of the present invention are directed to a semiconductor integrated circuit capable of expanding a bandwidth easily according to a stack structure of semiconductor chips.

Various exemplary embodiments of the present invention are directed to a semiconductor integrated circuit capable of efficiently performing a test operation on a boundary scan path.

In accordance with an exemplary embodiment of the present invention, a semiconductor integrated circuit may include a test bump pad, a first bump pad coupled to a first through-silicon-via (TSV), a second bump pad coupled to a second TSV, a latching unit, coupled between the test bump pad and the first bump pad, suitable for storing data, and a switching unit suitable for selectively coupling the first bump pad to the second bump pad in response to a test operation control signal.

In accordance with an exemplary embodiment of the present invention, a semiconductor integrated circuit including a first slice having a first test bump pad, a first bump pad and a second bump pad, and a second slice having a second test bump pad, a third bump pad and a fourth bump pad may include a test through-silicon-via (TSV) suitable for coupling the first test bump pad to the second test bump pad by penetrating the first slice, a first TSV suitable for coupling the first bump pad to the fourth bump pad by penetrating the first slice, a second TSV suitable for coupling the second bump pad to the third bump pad by penetrating the first slice, a first latching unit, disposed in the first slice and coupled between the first test bump pad and the first bump pad, suitable for storing data, a second latching unit, disposed in the second slice and coupled between the second test bump pad and the third bump pad, suitable for storing the data, and a first switching unit disposed in the first slice and suitable for selectively coupling the first bump pad to the second bump pad in response to a test operation control signal.

In accordance with an exemplary embodiment of the present invention, an operation method of a semiconductor integrated circuit including a first slice having a first test bump pad, a first bump pad and a second bump pad, and a second slice having a second test bump pad, a third bump pad and a fourth bump pad may include storing a first test data inputted through the first test bump pad in the first slice during a test input period, storing a second test data inputted through the first test bump pad and the second test bump pad in the second slice during the test input period, outputting the first test data stored in the first slice to the first bump pad during a first test output period, outputting the second test data stored in the second slice to the third bump pad, and storing the second test data as a transmission data in the first slice, during a second test output period, outputting the transmission data stored in the first slice to the first bump pad during a third test output period, and outputting the transmission data stored in the first slice to the second bump pad during a fourth test output period.

In accordance with an exemplary embodiment of the present invention, an operation method of a semiconductor integrated circuit including a test bump pad, a first bump pad coupled to a first through-silicon-via (TSV), and a second bump pad coupled to a second TSV may include storing test data inputted through the test bump pad during a test input period, outputting the test data to the first bump pad during a first test output period, storing a transmission data inputted from the second TSV during a second test output period, outputting the transmission data to the first bump pad during a third test output period, and outputting the transmission data to the second bump pad during a fourth test output period.

DETAILED DESCRIPTION

Figure 1:
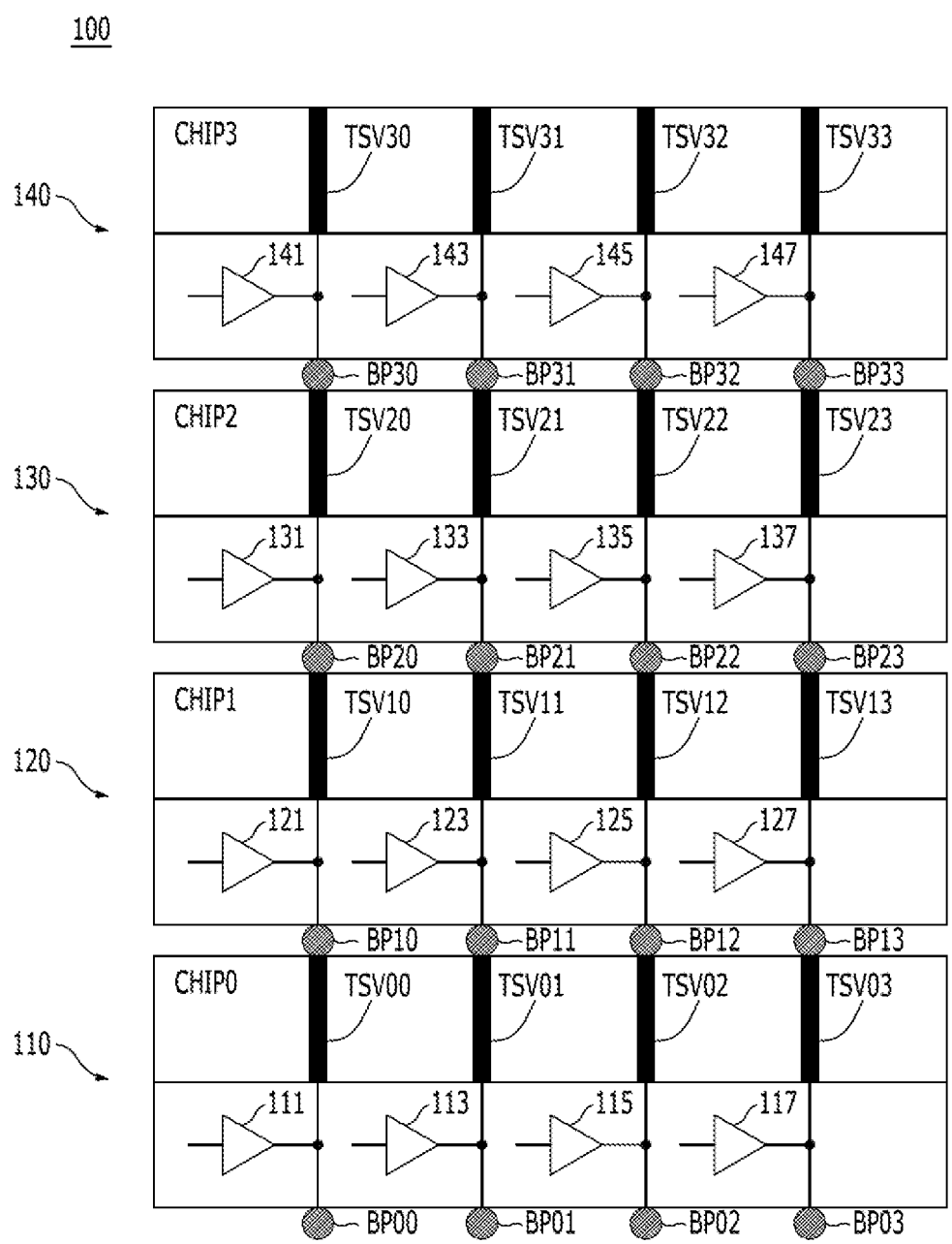
FIG. 1 is a block diagram illustrating a conventional semiconductor integrated circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exists or are added.

Figure 2:
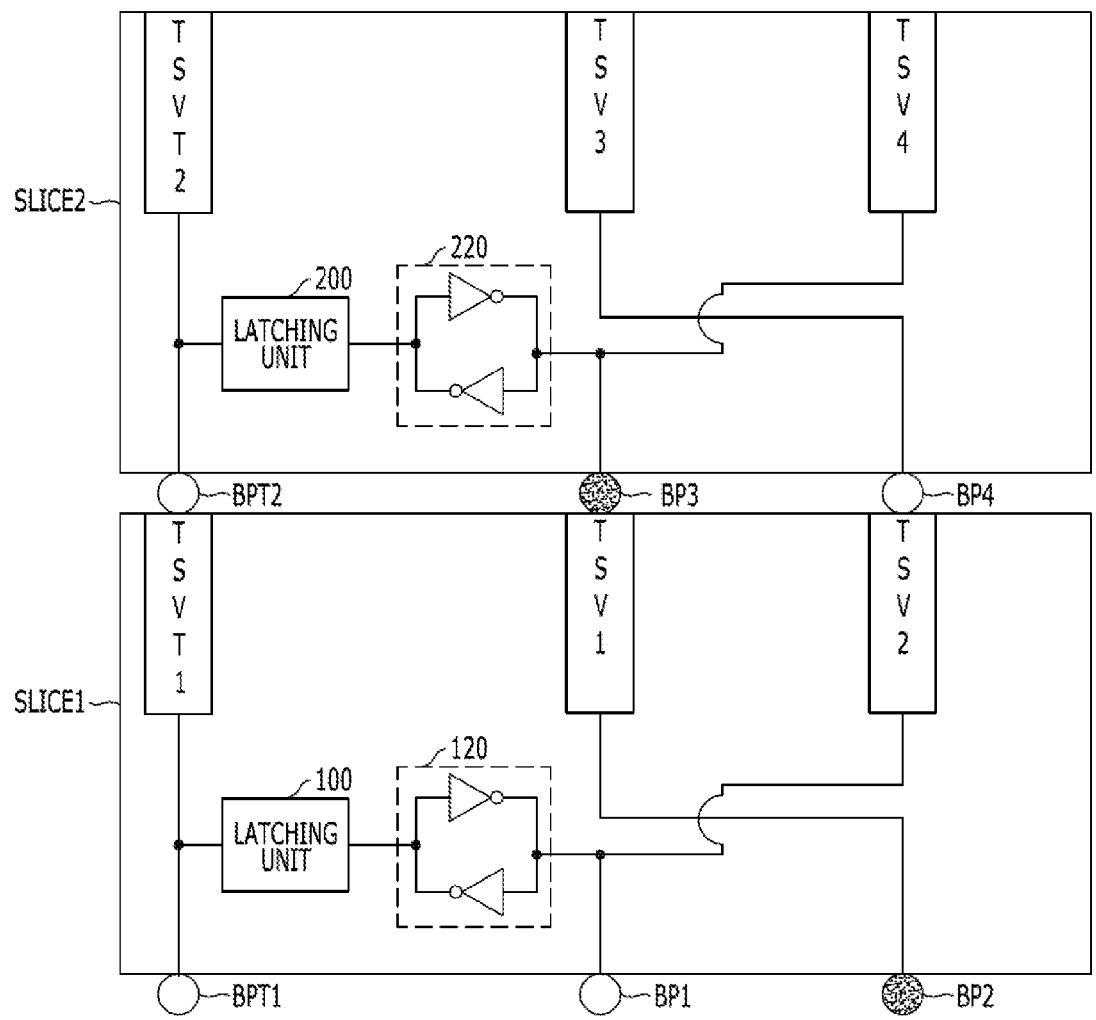
FIG. 2 is a block diagram illustrating a semiconductor integrated circuit in accordance with an exemplary embodiment of the present invention.

FIG. 2 is a block diagram illustrating a semiconductor integrated circuit in accordance with an exemplary embodiment of the present invention.

Referring to FIG. 2, the semiconductor integrated circuit in accordance with the exemplary embodiment of the present invention includes a first slice SLICE1 and a second slice SLICE2, which are sequentially stacked. That is, the second slice SLICE2 is stacked on the first slice SLICE1.

The first slice SLICE1 includes a first test bump pad BPT1, a first bump pad BP1, a second bump pad BP2, a first test TSV TSVT1, a first TSV TSV1, a second TSV TSV2, a first latching unit 100, and a first data transmission driving unit 120.

The second slice SLICE2 includes a second test bump pad BPT2, a third bump pad BP3, a fourth bump BP4, a second test TSV TSVT2, a third TSV TSV3, a fourth TSV TSV4, a second latching unit 200, and a second data transmission driving unit 220.

Herein, The first test bump pad BPT1, the first bump pad BP1 and the second bump pad BP2 are coupled to an external pad or a pin of the semiconductor integrated circuit. The second test bump pad BPT2 is coupled to the first test TSV TSVT1. The third bump pad BP3 is coupled to the first TSV TSV1. The fourth bump pad BP4 is coupled to the second TSV TSV2.

The first bump pad BP1 is coupled to the second TSV TSV2. The second bump pad BP2 is coupled to the first TSV TSV1. The third bump pad BP3 is coupled to the fourth TSV TSV4. The fourth bump pad BP4 is coupled to the third TSV TSV3. The first test bump pad BPT1 is coupled to the first test TSV TSVT1. The second test bump pad BPT2 is coupled to the second test TSV TSVT2.

That is, the first bump pad BP1 is coupled to the fourth bump pad PB4 and the third TSV TSV3 through the second TSV TSV2. The second bump pad BP2 is coupled to the third bump pad PB3 and the fourth TSV TSV4 through the first TSV TSV1.

Thus, although the first TSV1 is not directly coupled to the third TSV TSV3 each other, the first TSV1 and the third TSV TSV3 may be vertically overlapped. Also, although the second TSV2 is not directly coupled to the fourth TSV TSV4, the second TSV TSV2 and the fourth TSV TSV4 may be vertically overlapped.

The first test bump pad BPT1 is coupled to the second test bump pad BPT2 through the first test TSV TSVT1, and the second test bump pad BPT2 is coupled to the second test TSV TSVT2. Thus, the first test TSV TSVT1 and the second test TSV TSVT2 may be vertically overlapped, and the first test bump pad BT1 is serially coupled to the second test bump pad BPT2.

For reference, although only the first slice SLICE1 and the second slice SLICE2 are stacked in the drawings, the number of slices may be varied by a selection of a designer.

The first latching unit 100 is coupled to the first test bump pad BPT1 and the first bump pad BP1. The second latching unit 200 is coupled to the second test bump pad BPT2 and the third bump pad BP3. The first data transmission driving unit 120 is coupled between the first latching unit 100 and the first bump pad BP1. The second data transmission driving unit 220 is coupled between the second latching unit 200 and the third bump pad BP3.

The features of the semiconductor integrated circuit in accordance with the exemplary embodiment of the present invention will be summarized as follows.

Since the first bump pad BP1 is coupled to the first data transmission driving unit 120 and the second TSV TSV2, the first bump pad BP1 is used as a path for inputting or outputting data used in the first slice SLICE1.

On the other hand, since the second bump pad BP2 is coupled to the first TSV TSV1, the second bump pad BP2 is not used as a path for inputting or outputting data, but is used as only a path for inputting or outputting data to the first TSV TSV1.

Since one terminal of the third bump pad BP3 is coupled to the second data transmission driving unit 220 and the fourth TSV TSV4 of the second slice SLICE2, the third bump pad BP3 is used as a path for transferring data used in the second slice SLICE2. Since the other terminal of the third bump pad BP3 is coupled to the first TSV TSV1 of the first slice SLICE1, the data to be used in the second slice SLICE2 is inputted or outputted through the third bump pad BP3 of the second slice SLICE2, the first TSV TSV1 and the second bump pad BP2 of the first slice SLICE1. Thus, the second bump pad BP2 is prepared in the first slice SLICE1 to input or output data used in the second slice SLICE2.

Since the fourth bump pad BP4 is coupled to the third TSV TSV3, the fourth bump pad BP4 is not used as a path for inputting or outputting data to be used in the second slice SLICE2, but is used as only a path for transferring data to the third TSV TSV3.

In conclusion when the first slice SLICE1 and the second slice SLICE2 are not stacked and are individually configured in a single product, the first slice SLICE1 has the same configuration as the second slice SLICE2, and only the first bump pad BP1 and the third bump pad BP3 are used in the input or output of data. When the first slice SLICE1 and the second slice SLICE2 are stacked, the first slice SLICE1 inputs or outputs data used in the first slice SLICE1 through the first bump pad BP1, and inputs or outputs data used in the second slice SLICE2 through the second bump pad BP2. Herein, the second slice SLICE2 stacked on the first slice SLICE1 inputs or outputs the data to be used in the second slice SLICE2 through the third bump pad BP3, and does not use the fourth bump pad BP4. If the third slice (not shown) is stacked on the second slice SLICE2, the fourth bump pad BP4 is used to input or output data to be used in the third slice.

For reference, as shown in FIG. 2, it is referred to as a "swizzle structure" that the first slice SLICE1 and the second slice SLICE2 are sequentially stacked. That is, the swizzle structure indicates that a bandwidth of at least two semiconductor chips, which are stacked sequentially, is a different from a bandwidth of semiconductor chips, which are individually used in a single chip. Especially, as shown in FIG. 2, the swizzle structure easily varies a bandwidth by further including the second bump pad BP2, the fourth bump pad BP4, the first TSV TSV1, and the third TSV TSV3 without adding an extra circuit.

Meanwhile, in this embodiment, the first slice SLICE1 includes only one first bump pad BP1 and one second bump pad BP2, and the second slice SLICE2 includes only one third bump pad BP3 and one fourth bump pad BP4. However, in another embodiment, the first slice SLICE1 may include a plurality of couples of the first bump pad BP1 and the second bump pad BP2, and the second slice SLICE2 may include a plurality of couples of the third bump BP3 and the fourth bump pad BP4.

Figure 3A:
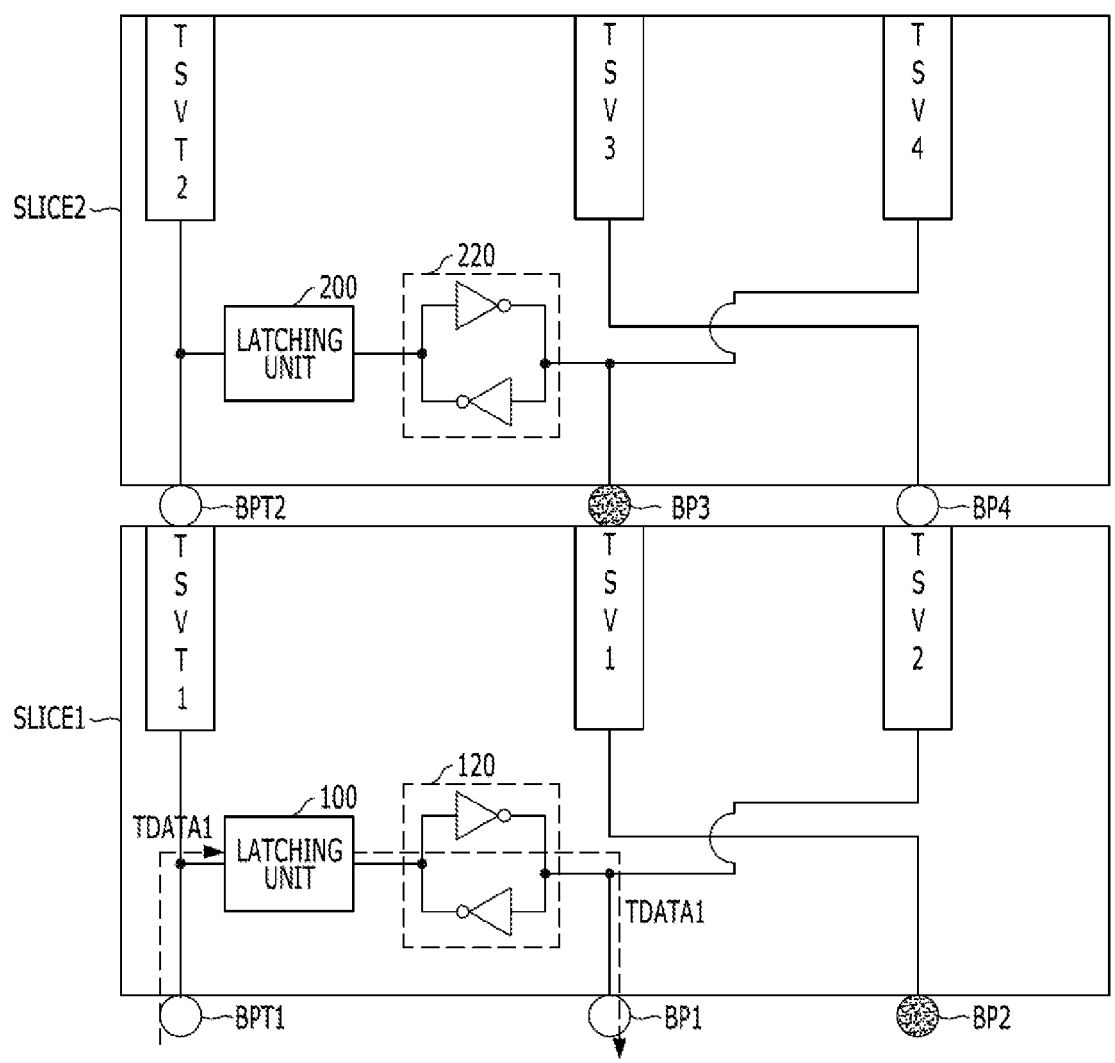
FIG. 3A is a block diagram illustrating an input/output operation of a first test data through a boundary scan path in the semiconductor integrated circuit shown in FIG. 2.

FIG. 3A is a block diagram illustrating an input/output operation of a first test data through a boundary scan path in the semiconductor integrated circuit shown in FIG. 2

Referring to FIG. 3A, the input/output operation of the first test data TDATA1 through the boundary scan path in the semiconductor integrated circuit will be described as below.

The first test data TDATA1 is received through the first test bump pad BPT1 of the first slice SLICE1 during a test input period, and is stored in the first latching unit 100 of the first slice SLICE1.

Herein, the first test data TDATA1 received through the first test bump pad BPT1 may be transferred to the second test bump pad BPT2 and the second latching unit 200 of the second slice SLICE2 through the first test TSV TSVT1, but may not be stored in the second latching unit 200 since the second latching unit 200 of the second slice SLICE2 is not enabled when the first latching unit 100 of the first slice SLICE1 is enabled. That is, as not shown in FIG. 3A, different control signals for determining an enable state are applied to the first latching unit 100 of the first slice SLICE1 and the second latching unit 200 of the second slice SLICE2.

The first test data TDATA1 stored in the first latching unit 200 of the first slice SLICE1 by the data input operation during the test input period are outputted through the first bump pad BP1 of the first slice SLICE1 during a first test output period after the test input period is terminated. Herein, the first test output period represents that the test data having a predetermined value is outputted during a first period for performing a boundary scan path test.

After a data input/output operation is performed during the test input period and the first test output period, it is determined whether an error occurs in the first bump pad BP1 of the first slice SLICE1 or not.

Figure 3B:
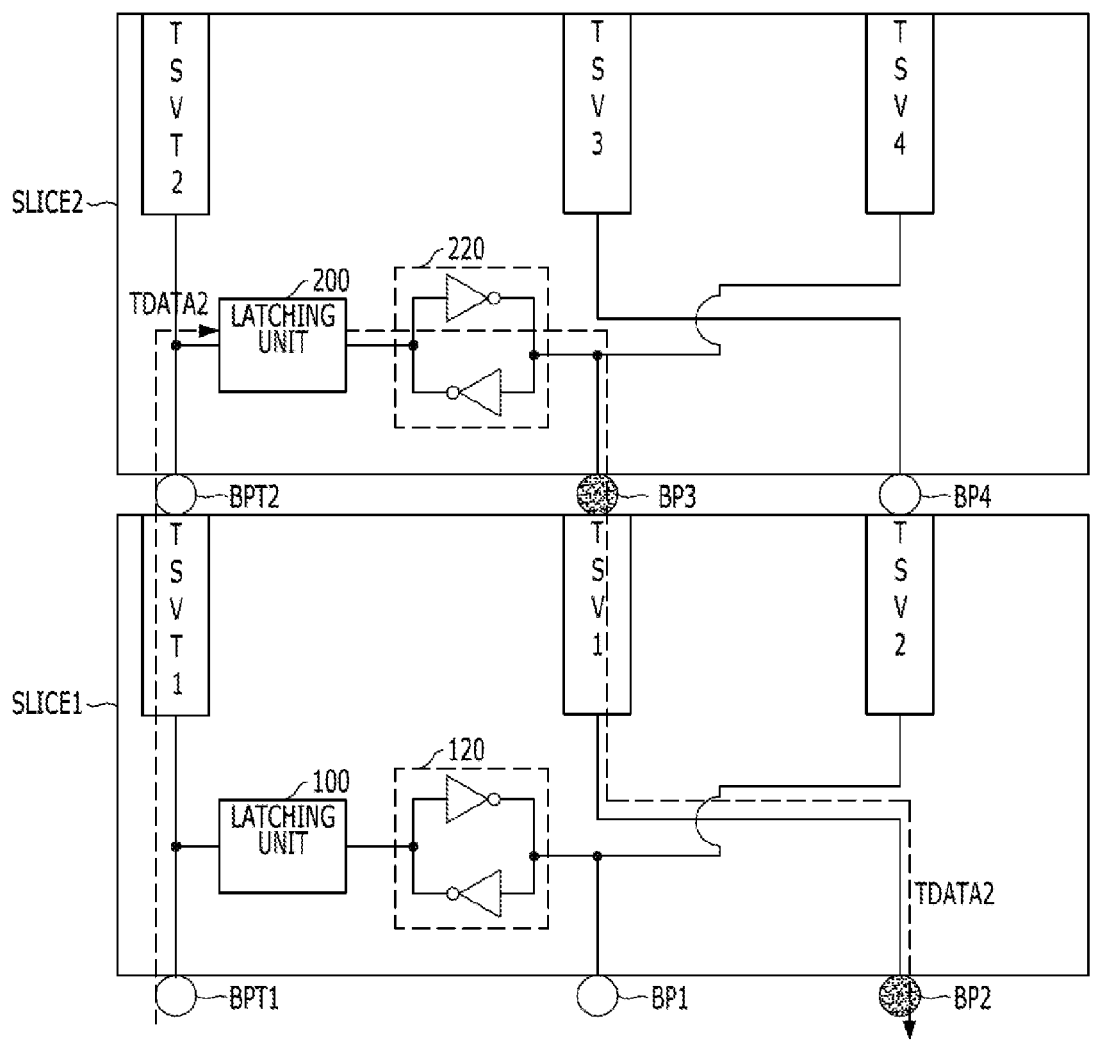
FIG. 3B is a block diagram illustrating an input/output operation of a second test data through a boundary scan path in the semiconductor integrated circuit shown in FIG. 2.

FIG. 3B is a block diagram illustrating an input/output operation of a second test data through a boundary scan path in the semiconductor integrated circuit shown in FIG. 2

Referring to FIG. 3B, the input/output operation of the second test data TDATA2 through the boundary scan path in the semiconductor integrated circuit will be described as below.

More specifically, the second test data TDATA2 is received through the first test bump pad BPT1 of the first slice SLICE1 during a test input period, and is stored in the second latching unit 200 of the second slice SLICE2 through the first test TSV TSVT1 and the second test bump pad BPT2.

When the second test data TDATA2 received through the first test bump pad BPT1 is stored in the second latching unit 200 of the second slice SLICE2, the second test data TDATA2 is transmitted to the first latching unit 100 of the first slice SLICE1. However, the second test data TDATA2 is not stored in the first latching unit 100 of the first slice SLICE1 since the first latching unit 100 is not enabled when the second latching unit 200 is enabled. That is, as not shown in FIG. 3B, different control signals for determining an enable state are applied to the first latching unit 100 and the second latching unit 200.

Herein, referring to FIGS. 3A and 3B, during the test input period, the first test data TDATA1 is stored in the first latching unit 100 of the first slice SLICE1, and then the second test data TDATA2 is stored in the second latching unit 200 of the second slice SLICE2 before the first test output period and a second test output period start.

The second test data TDATA2 stored in the second latching unit 200 of the second slice SLICE2 during the test input period is outputted through the third bump pad BP3, the first TSV TSV1 and the second bump pad BP2 during the second test output period after the test input period is terminated. The second test output period represents that the test data having a predetermined value is outputted during a second period for performing a boundary scan path test.

That is, the second test output period represents a test output operation, which is consecutively performed after the first test output period is terminated.

Such a result, after a data input/output operation is performed during the test input period and the second test output period as shown in FIG. 3B, it is determined whether an error occurs in the third bump pad BP3 of the second slice SLICE2 and the second bump pad BP2 of the first slice SLICE1 or not.

For reference, a boundary scan path test for the fourth bump pad BP4 is not performed since the fourth bump pad BP4 is a bump pad used only when a third slice (not shown) is stacked on the second slice SLICE2. Moreover, in another embodiment, if a plurality of couple of the first bump pad BP1 and the second bump pad BP2 of the first slice SLICE1 and the third bump pad BP3 and the fourth bump pad BP4 of the second slice SLICE2 are disposed in the first slice SLICE1 and the second slice SLICE2, respectively, the boundary scan path test for the first bump pad BP1, the second bump pad BP2, and the third bump pad BP3 may be performed by consecutively repeating the boundary scan path test shown in FIGS. 3A and 3B.

Meanwhile, referring to FIG. 3B, the data used in the second slice SLICE2 during the second output period is outputted through the third bump pad BP3 and the second bump pad BP2. It is detected whether an error occurs in the third bump pad BP3 and the second bump pad BP2 or not. If the error of the third bump pad BP3 and the second bump pad BP2 is detected, it is difficult to determine whether the error occurs in the third bump pad BP3 or an error occurs in the second bump pad BP2.

Figure 4:
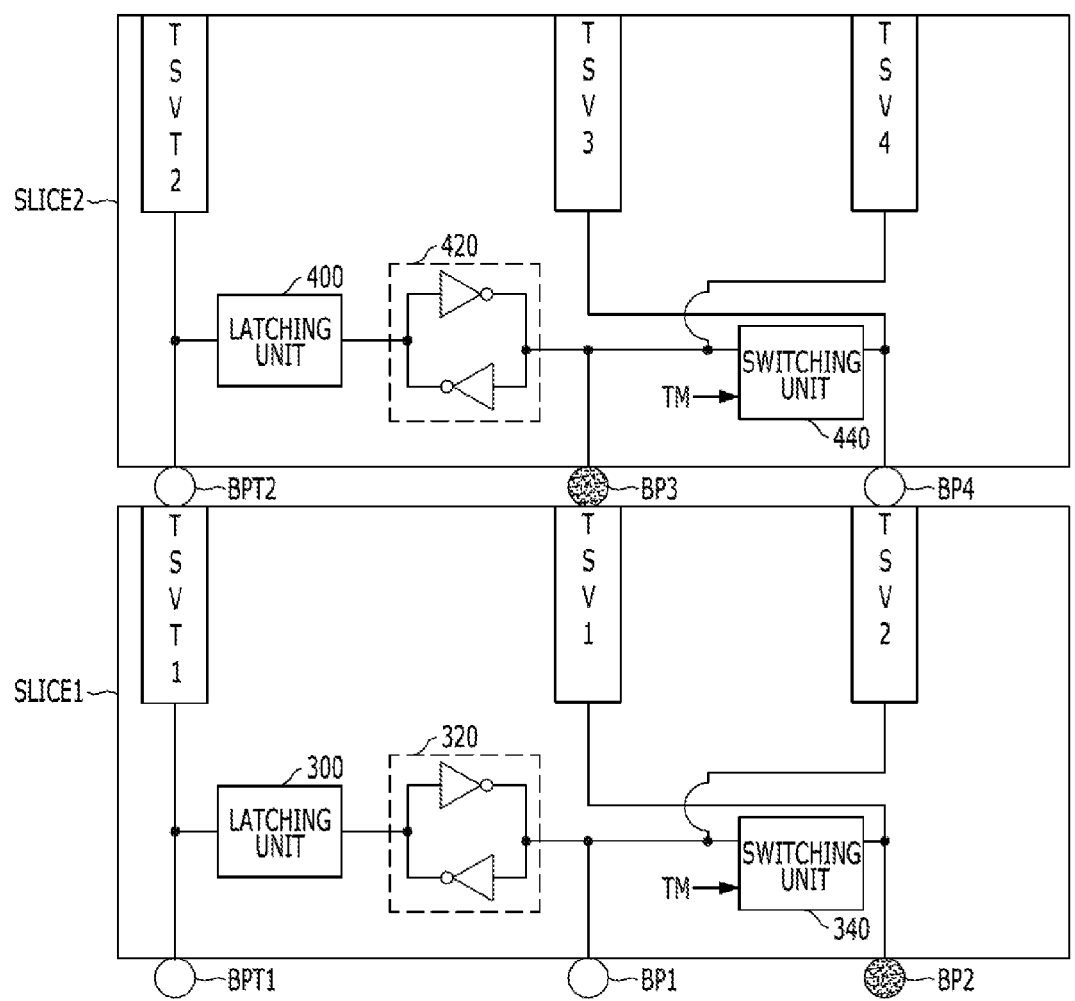
FIG. 4 is a block diagram illustrating a semiconductor integrated circuit in accordance with an exemplary embodiment of the present invention.

FIG. 4 is a block diagram illustrating a semiconductor integrated circuit in accordance with another exemplary embodiment of the present invention.

Referring to FIG. 4, the semiconductor integrated circuit in accordance with another exemplary embodiment of the present invention includes a first slice SLICE1 and a second slice SLICE2, which are sequentially stacked. That is, the second slice SLICE2 is stacked on the first slice SLICE1.

The first slice SLICE1 includes a first test bump pad BPT1, a first bump pad BP1, a second bump BP2, a first test TSV TSVT1, a first TSV TSV1, a second TSV TSV2, a first latching unit 300, a first data transmission driving unit 320, and a first switching unit 340.

The second slice SLICE2 includes a second test bump pad BPT2, a third bump pad BP3, a fourth bump BP4, a second test TSV TSVT2, a third TSV TSV3, a fourth TSV TSV4, a second latching unit 400, a second data transmission driving unit 420, and a second switching unit 440.

Herein, The first test bump pad BPT1, the first bump pad BP1 and the second bump pad BP2 are coupled to an external pad or a pin of the semiconductor integrated circuit. The second test bump pad BPT2 is coupled to the first test TSV TSVT1. The third bump pad BP3 is coupled to the first TSV TSV1. The fourth bump pad BP4 is coupled to the second TSV TSV2.

The first bump pad BP1 is coupled to the second TSV TSV2. The second bump pad BP2 is coupled to the first TSV TSV1. The third bump pad BP3 is coupled to the fourth TSV TSV4. The fourth bump pad BP4 is coupled to the third TSV TSV3. The first test bump pad BPT1 is coupled to the first test TSV TSVT1. The second test bump pad BPT2 is coupled to the second test TSV TSVT2.

That is, the first bump pad BP1 is coupled to the fourth bump pad PB4 and the third TSV TSV3 through the second TSV TSV2. The second bump pad BP2 is coupled to the third bump pad PB3 and the fourth TSV TSV4 through the first TSV TSV1.

Thus, although the first TSV1 is not directly coupled to the third TSV TSV3 each other, the first TSV1 and the third TSV TSV3 may be vertically overlapped. Also, although the second TSV2 is not directly coupled to the fourth TSV TSV4, the second TSV TSV2 and the fourth TSV TSV4 may be vertically overlapped.

The first test bump pad BPT1 is coupled to the second test bump pad BPT2 through the first test TSV TSVT1, and the second test bump pad BPT2 is coupled to the second test TSV TSVT2. Thus, the first test TSV TSVT1 and the second test TSV TSVT2 may be vertically overlapped, and the first test bump pad BT1 is serially coupled to the second test bump pad BPT2.

For reference, although only the first slice SLICE1 and the second slice SLICE2 are stacked in the drawings, the number of slices may be varied by a selection of a designer.

The first latching unit 300 is coupled to the first test bump pad BPT1 and the first bump pad BP1. The second latching unit 400 is coupled to the second test bump pad BPT2 and the third bump pad BP3. The first data transmission driving unit 320 is coupled between the first latching unit 300 and the first bump pad BP1. The second data transmission driving unit 420 is coupled between the second latching unit 400 and the third bump pad BP3.

The first switching unit 340 of the first slice SLICE1 is coupled between the first bump pad BP1 and the second bump pad BP2 to selectively couple the first bump pad BP1 to the second bump pad BP2 in response to a test operation control signal TM. That is, the first switching unit 340 varies a data transmission path by selectively coupling the first bump pad BP1 to the second bump pad BP2. The second switching unit 440 of the second slice SLICE2 is coupled between the third bump pad BP3 and the fourth bump pad BP4 to selectively couple the third bump pad BP3 to the fourth bump pad BP4 in response to the test operation control signal TM. That is, the second switching unit 440 varies a data transmission path by selectively coupling the third bump pad BP3 to the fourth bump pad BP4.

The features of the semiconductor integrated circuit in accordance with the exemplary embodiment of the present invention will be summarized as follows.

Since the first bump pad BP1 is coupled to the first data transmission driving unit 320, the second TSV TSV2 and the first switching unit 340, the first bump pad BP1 is used as a path for inputting or outputting data used in the first slice SLICE1.

The second bump pad BP2 is coupled to the first TSV TSV1, and may be selectively coupled to the first bump pad BP1 by the first switching unit 340. Thus, when the first switching unit is disabled and the first bump pad BP1 and the second bump pad BP2 are disconnected, the second bump pad BP2 is not used as a path for inputting or outputting data used in the first slice SLICE1, but is used as a path for transferring data to the first TSV TSV1 of the first slice SLICE1. On the other hand, when the first switching unit 340 is enabled and the first bump pad BP1 is coupled to the second bump pad BP2, the second bump pad BP2 may be used as a path for inputting or outputting data used in the first slice SLICE1.

Since one terminal of the third bump pad BP3 of the second slice SLICE2 is directly coupled to the second data transmission driving unit 420, the fourth TSV TSV4 and the second switching unit 440, the third bump pad BP3 is used as a path for inputting or outputting data used in the second slice SLICE2. Since the other terminal of the third bump pad BP3 is coupled to the first TSV TSV1 of the first slice SLICE1, the data to be used in the second slice SLICE2 is inputted or outputted through the third bump pad BP3 of the second slice SLICE2, the first TSV TSV1 and the second bump pad BP2 of the first slice SLICE1. Thus, the second bump pad BP2 is prepared in the first slice SLICE1 to input or output data used in the second slice SLICE2.

The fourth bump pad BP4 is coupled to the third TSV TSV3, and may be selectively coupled to the third bump pad BP3 by the second switching unit 440. Thus, when the second switching unit 440 is disabled and the third bump pad BP3 is disconnected to the fourth bump pad BP4, the fourth bump pad BP4 is not used as a path for inputting or outputting data used in the second slice SLICE2. However, the fourth bump pad PB4 is used as a path for transferring data to the third TSV TSV3. On the other hand, when the second switching unit 440 is enabled and the third bump pad BP3 is coupled to the fourth bump pad BP4, the fourth bump pad BP4 is used as a path for inputting or outputting data used in the second slice SLICE2.

In conclusion, when the first slice SLICE1 and the second slice SLICE2 are not stacked and are individually configured in a single product, the first slice SLICE1 has the same configuration as the second slice SLICE2, and only the first bump pad BP1 and the third bump pad BP3 are used in the input or output of data. When the first slice SLICE1 and the second slice SLICE2 are stacked, the first slice SLICE1 inputs or outputs data used in the first slice SLICE1 through the first bump pad BP1, and inputs or outputs data used in the second slice SLICE2 through the second bump pad BP2. Herein, the second slice SLICE2 stacked on the first slice SLICE1 inputs or outputs the data to be used in the second slice SLICE2 through the third bump pad BP3, and does not, use the fourth bump pad BP4. If the third slice (not shown) is stacked on the second slice SLICE2, the fourth bump pad BP4 is used to input or output data to be used in the third slice.

For reference, as shown in FIG. 4, it is referred to as a "swizzle structure" that the first slice SLICE1 and the second slice SLICE2 are sequentially stacked. That is, the swizzle structure indicates that a bandwidth of at least two semiconductor chips, which are stacked sequentially, is a different from a bandwidth of semiconductor chips, which are individually used in a single chip. Especially, as shown in FIG. 4, the swizzle structure easily varies a bandwidth by further including the second bump pad BP2, the fourth bump pad BP4, the first TSV TSV1 and the third TSV TSV3 without adding an extra circuit.

Meanwhile, in this embodiment, the first slice SLICE1 includes only one first bump pad BP1 and one second bump pad BP2, and the second slice SLICE2 includes only one third bump pad BP3 and one fourth bump pad BP4. However, in another embodiment, the first slice SLICE1 may include a plurality of couples of the first bump pad BP1 and the second bump pad BP2, and the second slice SLICE2 may include a plurality of couples of the third bump BP3 and the fourth bump pad BP4.

If the first switching unit 340 and the second switching unit 440 are enabled when an operation for inputting or outputting data used in the first slice SLICE1 and the second SLICE2 is performed, this operation may be an inefficient operation. However, the first switching unit 340 and the second switching unit 440 may efficiently perform an operation for a boundary scan path test as described in below with reference to FIGS. 5A to 5C.

Figure 5A:
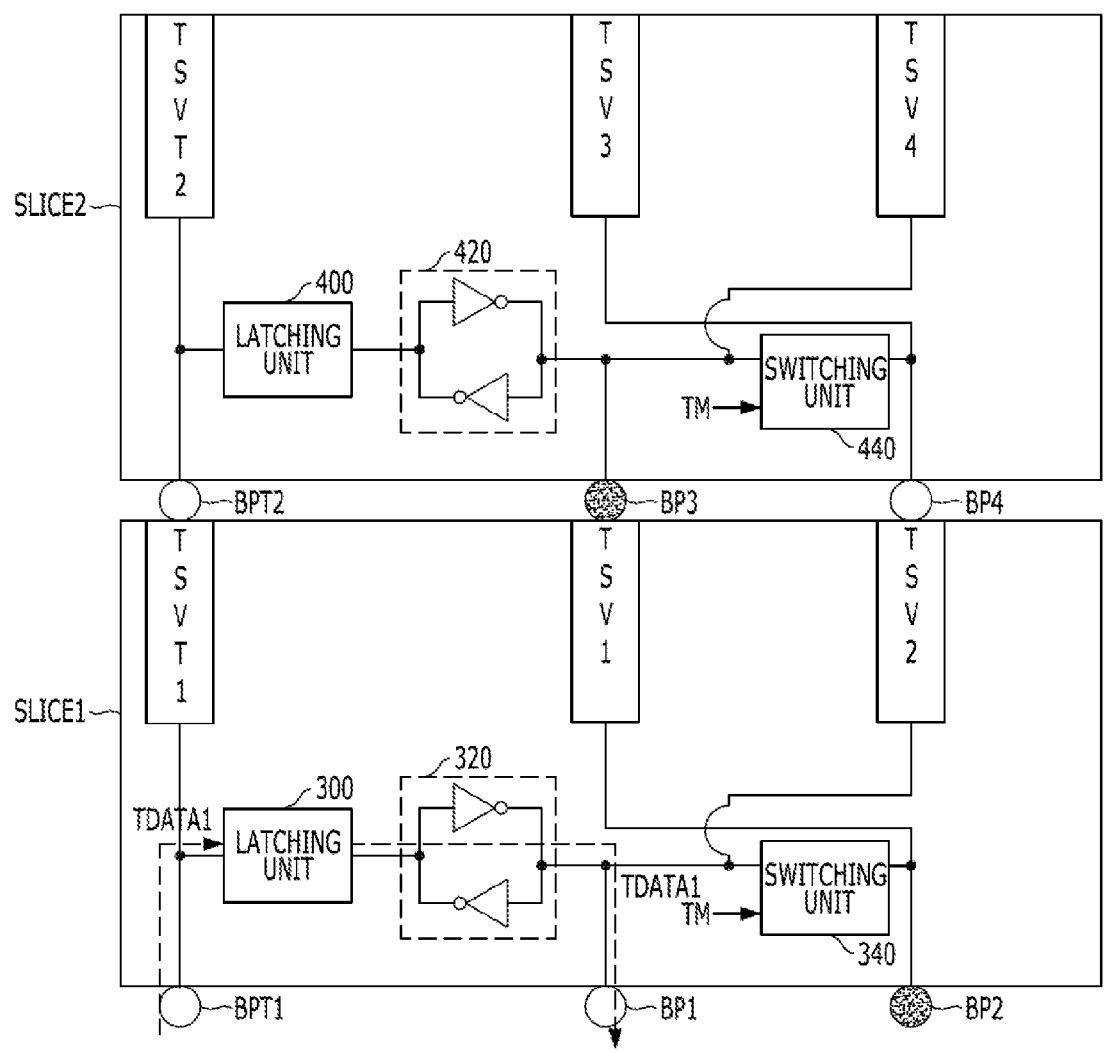
FIG. 5A is a block diagram illustrating an input/output operation of a first test data through a boundary scan path in the semiconductor integrated circuit shown in FIG. 4.
Figure 5B:
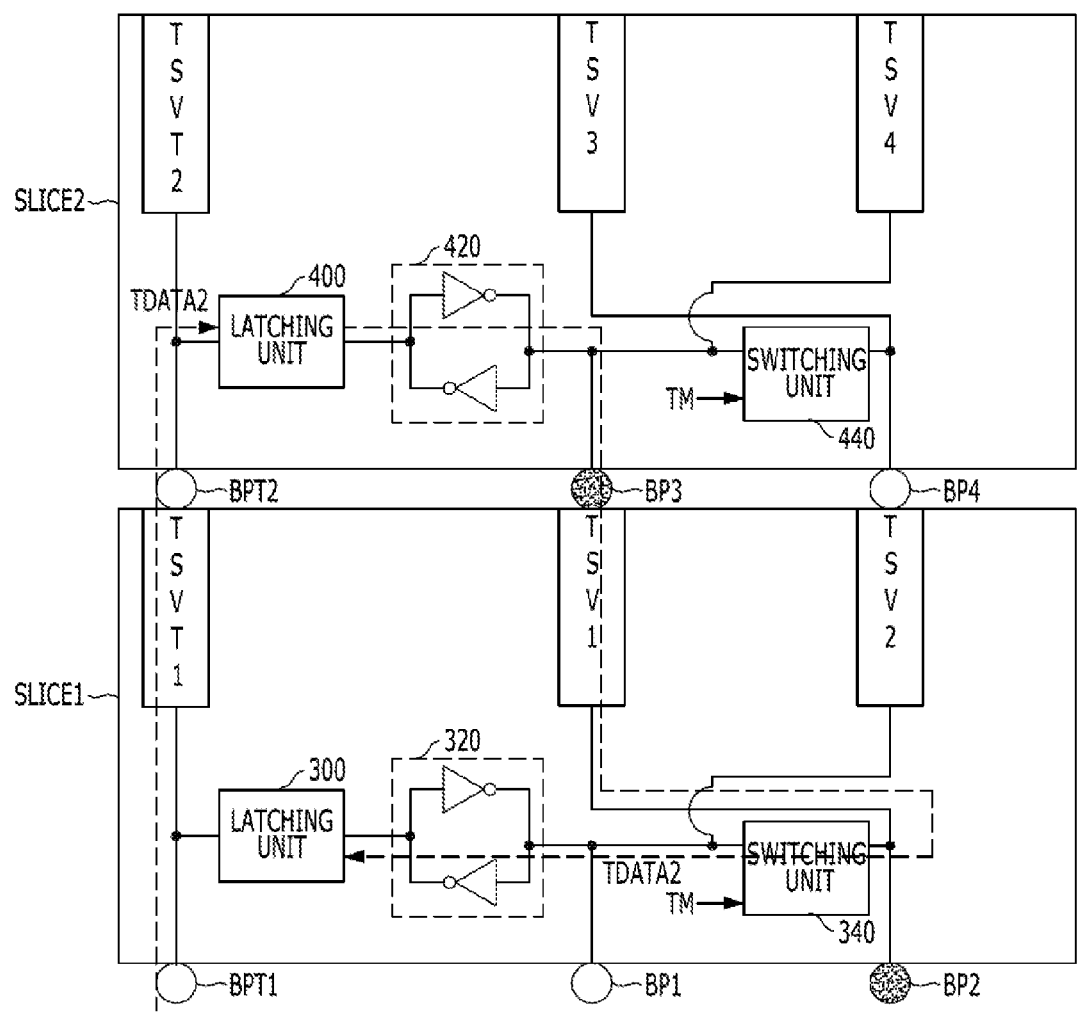
FIG. 5B is a block diagram illustrating an input/output operation of a second test data through a boundary scan path in the semiconductor integrated circuit shown in FIG. 4.
Figure 5C:
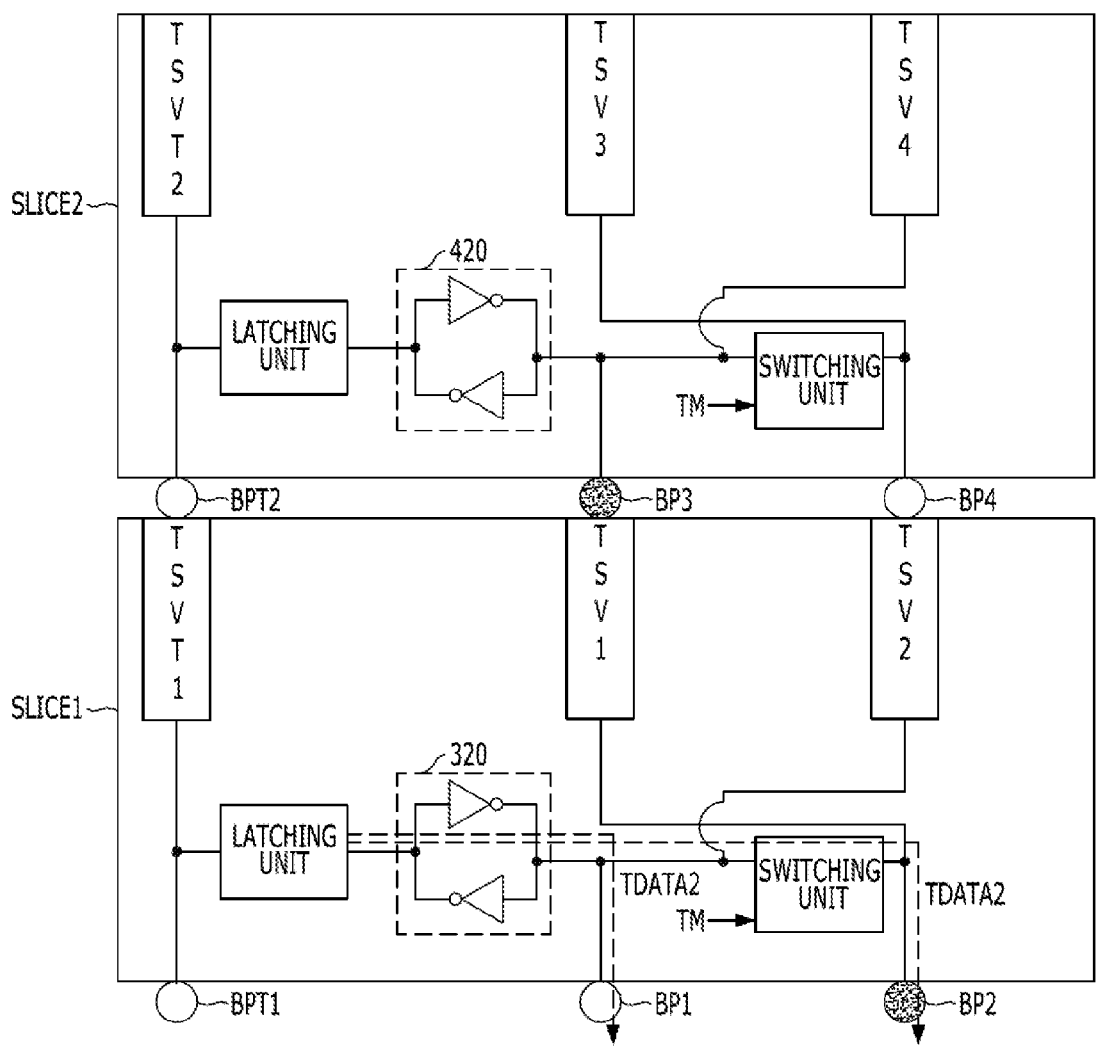
FIG. 5C is a block diagram illustrating an input/output operation of a third test data through a boundary scan path in the semiconductor integrated circuit shown in FIG. 4.

FIG. 5A is a block diagram illustrating an input/output operation of a first test data through a boundary scan path in the semiconductor integrated circuit shown in FIG. 4. FIG. 5B is a block diagram illustrating an input/output operation of a second test data through a boundary scan path in the semiconductor integrated circuit shown in FIG. 4. FIG. 5C is a block diagram illustrating an input/output operation of a third test data through a boundary scan path in the semiconductor integrated circuit shown in FIG. 4.

Referring to FIG. 5A, the input/output operation for the first test data TDATA1 is performed through the boundary scan path in a first slice SLICE1.

More specifically, the first test data TDATA1 is received through the first test bump pad BPT1 of the first slice SLICE1 during a test input period, and is stored in the first latching unit 300 of the first slice SLICE1.

Herein, as not shown in FIG. 5A, the first test data TDATA1 received through the first test bump pad BPT1 is outputted to the second test bump pad BPT2 and the second latching unit 400 of a second slice SLICE2, but is not stored in the second latching unit 400 of the second slice SLICE2 since the second latching unit 400 is not enabled when the first latching unit 300 is enabled. That is, as not shown in FIG. 5A, different control signals for determining an enable state of the first latching unit 300 and the second latching unit 400 are transferred to the first latching unit 300 and the second latching unit 400.

During the test input period, the first test data TDATA1 stored in the first latching unit 300 is outputted through the first bump pad BP1 during a first test output period after the test input period is terminated. The first test output period represents that the test data having a predetermined value is outputted during a first period for performing a boundary scan path test.

After a data input/output operation is performed during the test input period and the first test output period, it is determined whether an error occurs in the first bump pad BP1 of the first slice SLICE1 or not.

Referring to FIGS. 5B and 5C, the input/output operation of the second test data TDATA2 through the boundary scan path in the semiconductor integrated circuit will be described as below.

First, referring to FIG. 5B, the second test data TDATA2 is received through the first test bump pad BPT1 of the first slice SLICE1 during a test input period, and is stored in the second latching unit 400 of the second slice SLICE2 through the first test TSV TSVT1 and the second test bump pad BPT2.

When the second test data TDATA2 received through the first test bump pad BPT1 is stored in the second latching unit 400 of the second slice SLICE2, the second test data TDATA2 is transmitted to the first latching unit 300 of the first slice SLICE1. However, the second test data TDATA2 is not stored in the first latching unit 300 of the first slice SLICE1 since the first latching unit 300 is not enabled when the second latching unit 400 is enabled. That is, as not shown in FIG. 5B, different control signals for determining an enable state are applied to the first latching unit 300 and the second latching unit 400.

Herein, referring to FIGS. 5A and 56, during the test input period, the first test data TDATA1 is stored in the first latching unit 300 of the first slice SLICE1, and then the second test data TDATA2 is stored in the second latching unit 400 of the second slice SLICE2 before the first test output period and a second test output period start.

The second test data TDATA2 stored in the second latching unit 400 of the second slice SLICE2 during the test input period is outputted to the first latching unit 300 through the third bump pad BP3 of the second slice SLICE2, the first TSV TSV1 and the first switching unit 340 of the first slice SLICE1 during the second test output period after the test input period is terminated. That is, during the second test output period, the first switching unit 340 is enabled, and the data outputted from the third bump pad BP3 of the second slice SLICE2 is stored in the first latching unit 300 instead of being outputted to the second bump pad BP2.

The second test output period represents the test output operation which is consecutively performed after the first test output period shown in FIG. 5A. The first latching unit 300 outputs the data, which is stored during the first test output period, through the first bump pad BP1. Thus, at the starting point of the second test output period, the data stored in the first latching unit 300 may be changed into another data irrespective of any influence. The data stored in the second latching unit 400 during the second test output period may be outputted through the third bump pad BP3 of the second slice SLICE2, and is stored in the first latching unit 300. An error-detected result of the third bump pad BP3 may be included in the data stored in the first latching unit 300. That is, when an error occurs in the third bump pad BP3, the data stored in the first latching unit 300 will be not a normal state. When an error does not occur in the third bump pad BP3, the data stored in the first latching unit 300 will be a normal state.

Referring to FIG. 5C, the data stored in the first latching unit 300 during the second test output period is once outputted through the first bump pad BP1 during a third test output period, and is one more outputted through the second bump pad BP2 during a fourth test output period.

More specifically, the data stored in the first latching unit 300 during the second test output period, is outputted through the first bump pad BP1 during the third test output period. Such an operation may detect an error state of the third bump pad BP3. That is, an error state of the first bump pad BP1 is determined during the first test output period, and the error state of the third bump pad BP3 may be detected when the data stored in the first latching unit 300 is outputted through the first bump pad BP1 during the third test output period since the data stored in the first latching unit 300 indicates the error state of the third bump pad BP3. During the third test output period, the first switching unit 340 may be not need to be enabled.

The data stored in the first latching unit 300 during the second test output period is outputted through the second bump pad BP2 during the fourth test output period. Such an operation may detect an error state of the second bump pad BP2. That is, since the error state of the first bump pad BP1 is determined during the third test output period, the reliability for the data stored in the first latching unit 300 may be improved.

Herein, the data stored in the first latching unit 300 during the fourth test output period is outputted through second bump pad BP2. Such an operation may detect the error state of the second bump pad BP2. Since the first switching unit 340 is enabled, the data stored in the first latching unit 300 is outputted to the second bump pad BP2.

The first switching unit 340 included in the first slice SLICE1 may separately detect the error state of the second bump pad BP2 and the third bump pad BP3 by coupling the first bump pad BP1 to the second bump pad BP2 during the second test output period and the fourth test output period in which the test operation control signal TM is activated. For reference, the first switching unit 340 may disconnect the first bump pad BP1 from the second bump pad BP2 during the first test output period, the third test output period and the test input period in which the test operation control signal TM is inactivated.

Especially, since a repair operation on a bump pad having an error is selectively performed by a unit of the slices, when it is correctly detected that an error occurs in the third bump pad BP3 of the second slice SLICE2 or the second bump pad BP2 of the first slice SLICE1, the repair operation may be efficiently performed.

For reference, a boundary scan path test for the fourth bump pad BP4 of the second slice SLICE2 is not performed since the fourth bump pad is used in case that a third slice (not shown) is stacked on the second slice SLICE2. That is, as shown in FIGS. 5A to 5C, in case that only the first slice SLICE1 and the second slice SLICE2 are stacked, since the data is not inputted or outputted through the fourth bump pad BP4, the boundary scan path test is not performed.

Moreover, in case that a couple of the first bump pad BP1 and the second bump pad BP2, and a couple of the third bump pad BP3 and the fourth bump pad BP4 are consecutively arrayed in the first slice SLICE1 and the second slice SLICE2, respectively, the boundary scan path test for the first bump pad BP1, the second bump pad BP2 and the third bump pad BP3 may be performed by repeatedly using the boundary scan path test shown in FIGS. 5A to 5C.

As described above, when a semiconductor device includes bump pads and TSVs having a swizzle structure, the semiconductor device may use a different bandwidth without adding a separate circuit when the semiconductor device is used in a single product or at least two semiconductor devices are stacked.

Moreover, when a plurality of semiconductor chips having a swizzle structure are stacked, a boundary scan path test may be performed in each of the semiconductor chips.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit comprising:
   a test bump pad coupled to a test through-silicon-via (TSV);
   a first bump pad coupled to a second TSV;
   a second bump pad coupled to a first TSV;
   a latching unit, coupled between the test bump pad and the first bump pad, suitable for storing data; and
   a switching unit suitable for selectively coupling the first bump pad to the second bump pad in response to a test operation control signal,
   wherein the first bump pad is disposed closer than the second bump pad to the test bump pad, and the first TSV is disposed closer than the second TSV to the test TSV.

2. The semiconductor integrated circuit of claim 1, wherein the latching unit stores test data inputted through the test bump pad during a test input period, outputs the test data to the first bump pad during a first test output period, receives and stores a transmission data from the first TSV through the switching unit during a second test output period, outputs the transmission data to the first bump pad during a third test output period, and outputs the transmission data to the second bump pad during a fourth test output period.

3. The semiconductor integrated circuit of claim 2, wherein the switching unit disconnects the first bump pad from the second bump pad during the first test output period, the third test output period, and the test input period in which the test operation control signal is inactivated, and couples the first bump pad to the second bump pad during the second test output period and the fourth output period in which the test operation control signal is activated.

4. The semiconductor integrated circuit of claim 3, wherein the first to fourth test output periods are sequentially performed after the test input period is terminated.

5. The semiconductor integrated circuit of claim 2, further comprising:
   a data transmission driving unit, coupled between the latching unit and the first bump pad, suitable for transmitting the test data or the transmission data.

6. A semiconductor integrated circuit including a first slice having a first test bump pad, a first bump pad and a second bump pad, and a second slice having a second test bump pad, a third bump pad and a fourth bump pad, the semiconductor integrated circuit comprising:
   a test through-silicon-via (TSV) suitable for coupling the first test bump pad to the second test bump pad by penetrating the first slice;
   a second TSV suitable for coupling the first bump pad to the fourth bump pad by penetrating the first slice;
   a first TSV suitable for coupling the second bump pad to the third bump pad by penetrating the first slice;
   a first latching unit, disposed in the first slice and coupled between the first test bump pad and the first bump pad, suitable for storing data;
   a second latching unit, disposed in the second slice and coupled between the second test bump pad and the third bump pad, suitable for storing the data; and
   a first switching unit, disposed in the first slice, suitable for selectively coupling the first bump pad to the second bump pad in response to a test operation control signal,
   wherein the first bump pad is disposed closer than the second bump pad to the first test bump pad, the third bump pad is disposed closer than the fourth bump pad to the second test bump, and the first TSV is disposed closer than the second TSV to the test TSV.

7. The semiconductor integrated circuit of claim 6, further comprising:
   a third TSV coupled to the third bump pad by penetrating the second slice;
   a fourth TSV coupled to the fourth bump pad by penetrating the second slice; and
   a second switching unit, disposed in the second slice, suitable for selectively coupling the third bump pad to the fourth bump pad in response to the test operation control signal.

8. The semiconductor integrated circuit of claim 7, wherein the first TSV and the third TSV are vertically overlapped, and the second TSV and the fourth TSV are vertically overlapped.

9. The semiconductor integrated circuit of claim 6, wherein the first latching unit stores a first test data inputted through the first test bump pad during a test input period, outputs the first test data to the first bump pad during a first test output period, receives and stores a transmission data from the first TSV through the first switching unit during a second test output period, outputs the transmission data to the first bump pad during a third test output period, and outputs the transmission data to the second bump pad during a fourth test output period.

10. The semiconductor integrated circuit of claim 9, wherein the second latching unit stores a second test data inputted through the second test bump pad and the first test TSV during the test input period, outputs the second test data to the third bump pad and the second TSV as the transmission data during the second test output period.

11. The semiconductor integrated circuit of claim 10, wherein the first switching unit disconnects the first bump pad from the second bump pad during the first test data output period, the third test data output period and the test input period in which the test operation control signal is inactivated, and couples the first bump pad to the second bump pad during the second test data output period and the fourth test data output period in which the test operation control signal is activated.

12. The semiconductor integrated circuit of claim 11, wherein the first test data and the second test data are sequentially inputted through the first test bump pad during the test input period.

13. The semiconductor integrated circuit of claim 11, wherein the first to fourth test output periods are sequentially performed after the test input period is terminated.

14. The semiconductor integrated circuit of claim 10, further comprising:
   a first data transmission driving unit, disposed in the first slice and coupled between the first latching unit and the first bump pad, suitable for transmitting the first test data or the transmission data; and
   a second data transmission driving unit, disposed in the second slice and coupled between the second latching unit and the third bump pad, suitable for transmitting the second test data.

15. An operation method of a semiconductor integrated circuit including a first slice having a first test bump pad, a first bump pad and a second bump pad, and a second slice having a second test bump pad, a third bump pad and a fourth bump pad, the operation method comprising:
   storing a first test data inputted through the first test bump pad in the first slice during a test input period;
   storing a second test data inputted through the first test bump pad and the second test bump pad in the second slice during the test input period;
   outputting the first test data stored in the first slice to the first bump pad during a first test output period;
   outputting the second test data stored in the second slice to the third bump pad, and storing the second test data as a transmission data in the first slice, during a second test output period;
   outputting the transmission data stored in the first slice to the first bump pad during a third test output period; and
   outputting the transmission data stored in the first slice to the second bump pad during a fourth test output period.

16. The operation method of the semiconductor integrated circuit of claim 15, wherein the first bump pad is separated from the second bump pad during the first test data output period, the third test data output period and the test input period, and the first bump pad is coupled to the second bump pad during the second test data output period and the fourth test data output period.

17. The operation method of the semiconductor integrated circuit of claim 16, further comprising:
   transmitting the first test data to the first bump pad during the first test output period; and
   transmitting the second test data to the third bump pad, and transmitting the second data inputted from the third bump pad as the transmission data to the first slice, during the second test output period.

18. An operation method of a semiconductor integrated circuit that includes a test bump pad coupled to a test throughsilicon-via (TSV), a first bump pad coupled to a second TSV, and a second bump pad coupled to a first TSV, the operation method comprising:
- storing test data inputted through the test bump pad during a test input period;
- outputting the test data to the first bump pad during a first test output period;
- storing a transmission data inputted from the first TSV by selectively coupling the first bump pad to the second bump pad in response to a test operation control signal during a second test output period;
- outputting the transmission data to the first bump pad during a third test output period; and
- outputting the transmission data to the second bump pad during a fourth test output period,
- wherein the first bump pad is disposed closer than the second bump pad to the test bump pad, and the first TSV is disposed closer than the second TSV to the test TSV.

19. The operation method of claim 18, wherein the semiconductor integrated circuit disconnects the first bump pad from the second bump pad during the first test output period, the third test output period, and the test input period, and couples the first bump pad to the second bump pad during the second test output period and the fourth output period.

20. The operation method of claim 18, further comprising:
transmitting the test data to the first bump pad during the first test output period; and
transmitting the transmission data inputted from the second TSV during the second test output period.

21. A semiconductor integrated circuit comprising:
- a test bump pad coupled to a test through-silicon-via (TSV);
- a first bump pad coupled to a second TSV;
- a second bump pad coupled to a first TSV;
- a latching unit, coupled between the test bump pad and the first bump pad, suitable for storing data; and
- a switching unit suitable for selectively coupling the first bump pad to the second bump pad in response to a test operation control signal,
- wherein a coupling between the first bump pad and the second TSV and a coupling between the second bump pad and the first TSV cross each other and wherein the first bump pad is disposed closer than the second bump pad to the test bump pad, and the first TSV is disposed closer than the second TSV to the test TSV.

* * * * *